United States Patent [19]

James et al.

[11] 4,107,351
[45] Aug. 15, 1978

[54] METHOD OF DEPOSITING OR REPAIRING A PATTERNED METAL LAYER ON A SUBSTRATE

[75] Inventors: Edward Anthony James, Manville; Philip Kuznetzoff, Somerville, both of N.J.

[73] Assignee: RCA Corporation, New York, N.Y.

[21] Appl. No.: 732,782

[22] Filed: Oct. 15, 1976

[51] Int. Cl.² .......................... C23F 1/02; C23F 17/00
[52] U.S. Cl. ........................................ 427/43; 96/36.2; 96/38.3; 427/304; 427/305; 427/437; 427/438; 29/401 R
[58] Field of Search ................. 427/43, 304, 305, 437, 427/438; 96/36.2, 38.3, 401 R; 29/401 R

[56] References Cited
U.S. PATENT DOCUMENTS 3,615,471 10/1971 Lenoble et al. .................. 96/36.2 X
3,753,816 8/1973 Feldstein et al. ................. 96/38.3 X
3,779,758 12/1973 Polichette ............................ 96/36.2
3,833,375 9/1974 Moscong et al. ...................... 96/36.2
3,945,826 3/1976 Friedman et al. ................ 96/36.2 X
3,960,561 6/1976 Haining et al. ....................... 96/36.2

Primary Examiner—Michael R. Lusignan
Attorney, Agent, or Firm—H. Christoffersen; Birgit E. Morris

[57] ABSTRACT

In a wholly additive process for depositing a patterned metal layer on an insulating substrate, the sensitized and activated substrate is coated with photoresist; a desired pattern is formed in the photoresist layer by exposing it to a mask and developing it using conventional techniques; the patterned surface is then contacted with a second developer solution containing the activator; a metal pattern is deposited by electroless metal plating; and the photoresist is removed.

9 Claims, 9 Drawing Figures

METHOD OF DEPOSITING OR REPAIRING A PATTERNED METAL LAYER ON A SUBSTRATE

This invention relates to the preparation of a metal pattern on an insulating substrate. More particularly, this invention relates to the preparation and repair of glass photomasks using a totally additive process.

BACKGROUND OF THE INVENTION

Photomasks for the electronics industry must be perfect and have high resolution. For TV picture tube shadowmasks, which are large in scale, about 2 feet by 3 feet (about 61 by 91 cm) and which have hundreds of thousands of metal dots deposited on the glass surface, the photomask must have no missing or malformed dots, since these result in corresponding imperfections on the cathode ray viewing screen which are visible and annoying to the viewer.

One well known method of making photomasks is to electrolessly deposit nickel alloy dots on the glass. These photomasks have satisfactory resolution and good abrasion resistance. However, it has proven to be almost impossible to make a photomask which does not have some missing or malformed dots. Generally, each mask has about 6 – 10 defects.

In the past, making or repairing the metal dots has been accomplished by either a subtractive or a semi-additive process.

U.S. Pat. No. 3,833,375 illustrates a subtractive process whereby a layer of nickel is electrolessly deposited on the surface of the photomask and the unwanted portions are removed using conventional photolithographic and etching techniques. This process has several disadvantages; it is wasteful of metal; and when the unwanted nickel is etched away, poor edge definition can occur due to undercutting and incomplete etching.

Feldstein in U.S. Pat. No. 3,753,816 discloses a method of repairing metal dots by depositing a relatively thin, etchable nickle film on the glass substrate, which metal is catalytic to the deposition of a second metal film, applying a photoresist over the first metal film, exposing and developing it to form the desired pattern, depositing a second, relatively thick and relatively unetchable metal film over the now exposed metal areas, then removing the photoresist and etching way the etchable metal film not covered by the second metal film. This process is only semi-additive in that some metal film must be etched away, although the metal dots themselves are put down only where they are wanted.

It would be desirable to apply the metal dots where wanted without having to apply unwanted metal and to have to etch it away. However, attempts to apply a photoresist directly onto the photomask surface, expose and develop the photoresist to leave openings where metal is to be deposited, and electrolessly plate metal in the openings, have proven entirely unsatisfactory because the metal will not plate directly on the exposed surface.

SUMMARY OF THE INVENTION

We have found that a pattern of metal can be applied to a substrate in a wholly additive process by applying a sensitizer and activator for subsequent electroless metal deposition onto the substrate, coating the surface with a photoresist, exposing and developing the photoresist to form the desired pattern of openings in the resist, then redeveloping the resist with a developer containing the activator and finally electrolessly depositing the metal in the openings and removing the remaining photoresist.

DETAILED DESCRIPTION OF THE INVENTION

Figure 1:
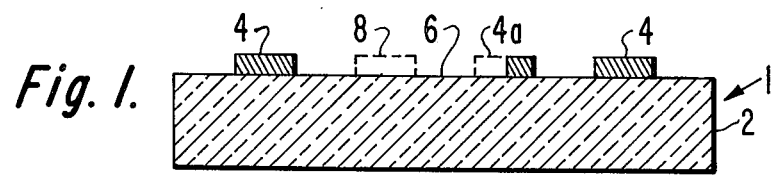
FIG. 1 is a cross-sectional view of a portion of a metal-on-glass photomask having defective sites to be repaired.

The process of the invention can be employed for many applications where a patterned metal layer is to be applied to an insulating substrate, but will be illustrated in detail with reference to the repair or preparation of a metal-on-glass photomask.

A glass photomask to be repaired is first cleaned thoroughly and dried. If the missing or imperfect dots to be repaired are on a localized area of the photomask, those areas alone can be repaired by covering the remainder of the mask or by surrounding the defective area with a dam of wax or other insoluble material. Defective or malformed dots can be removed if desired prior to repair.

The cleaned surface is then sensitized by treating with a solution of a tin salt, such as tin chloride. A suitable sensitizing bath contains 70 grams per liter of stannous chloride and 35 grams per liter of hydrochloric acid. The sensitized surface is rinsed with deionized water.

The sensitized surface is then activated by treating with a solution of noble metal salt such as gold chloride, potassium gold chloride or palladium chloride. Suitably, a solution containing 0.5 gram per liter of palladium chloride and 0.5 ml/1 of hydrochloric acid is employed. The activated surface is then rinsed, first with deionized water, then with acetone, and dried.

A layer of positive photoresist is then applied. The Shipley Company's AZ 1350 or AZ 111 photoresist are suitable. The photoresist can be dried and hardened by heating at about 70° – 75° C if desired. The plate is then exposed to ultra violet light through a mask of the desired pattern, followed by conventional developing, using for example Shipley AZ developer.

Now the photomask is subjected to a second development step, this time using a developer, which can be the Shipley AZ developer or a 0.15 – 0.2 Normal solution of sodium hydroxide, to which has been added the activator employed in the previous activation step. A concentration of about 0.5 g/1 of palladium chloride and 0.5 ml/1 of concentrated hydrochloric acid is suitable. A 15 second spray or immersion is generally adequate.

The activator can also be added to the original developer solvent, if desired. This eliminates the second development step, but does result in requiring more activator overall. Since the activator is expensive, this route is not presently preferred.

The substrate is then immersed into an electroless plating solution for 15–20 minutes. Metal will be plated directly over the defective dots and missing dots. The photoresist is then removed in conventional manner, as by immersing or spraying with acetone or other suitable solvent.

Although the mechanism for the success of the present process is not understood completely, it is presently believed that after the first photoresist development step, a thin, possible monomolecular, layer of photoresist remains covering the substrate to be plated, which interferes, or even prevents altogether, the deposition of metal. By developing with a developer solution containing the activator, it is believed this thin photoresist layer is swollen and the activator migrates through to the activated surface beneath so that subsequent plating can occur. Of course, the unexposed resist is not affected by the development step.

The repaired photomask is inspected, and, if satisfactorily repaired, the metal dots can be hardened, as by baking at about 375° C for one hour.

The invention will now be described further with reference to the accompanying drawings.

In FIG. 1, a photomask 1 to be repaired comprises a glass substrate 2 and a plurality of metal dots 4 on a surface 6 thereof. A malformed dot is shown as 4a and a missing dot 8 is outlined by a dashed line, as is the missing portion of dot 4a.

Figure 2:
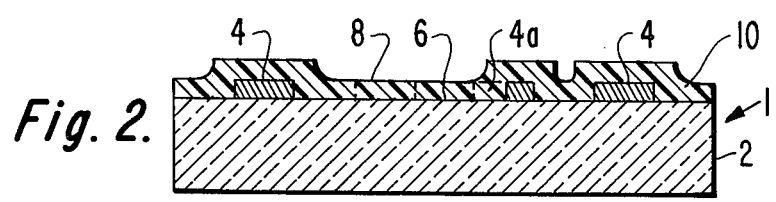
FIGS. 2, 3 and 4 are similar cross-sectional views illustrating successive steps in the repair method of the present invention.

FIG. 2 shows the whole of the defect area coated with a photoresist 10.

Figure 3:
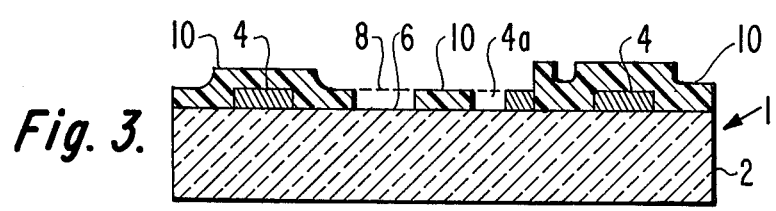

FIG. 3 shows the photoresist covered mask 1 after the development steps. The photoresist has been removed from the areas where the missing dot 8 is to be and from the malformed dot 4a. The metal dots 4 remain coated with the photoresist 10.

Figure 4:
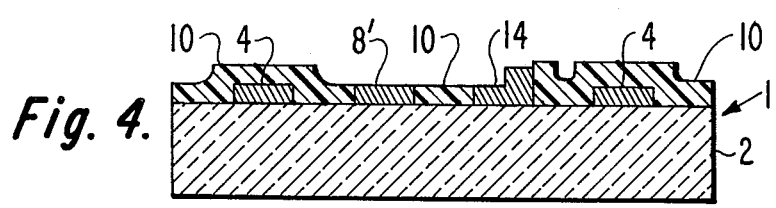
Figure 5:
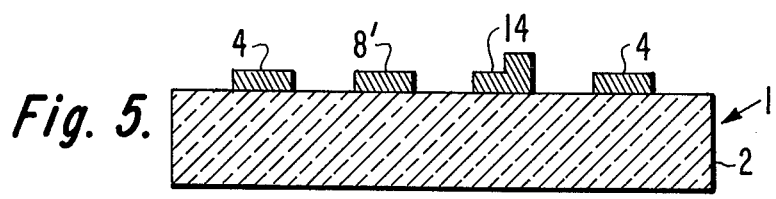
FIG. 5 is a cross-sectional view of the repaired portion of the photomask as illustrated in FIG. 1.
Figure 6:
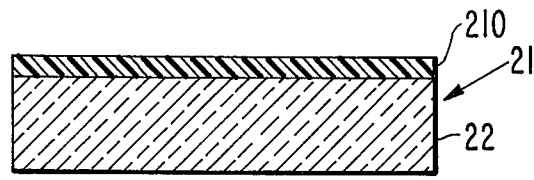
FIGS. 6 to 9 are cross-sectional views illustrating successive steps in making a metal-on-glass photomask in accordance with the fabrication method of the present invention.

FIG. 4 shows the photomask 1 after the metal plating step. A metal dot 8' has been deposited for the missing dot 8 and dot 14 is the completed dot 4a. The now repaired photomask 1 is shown in FIG. 5 after removal of the photoresist 10. The additional thickness of metal over a portion of the built up dot 14 has no deleterious effect on the ultimate utilization of the metal photomask since the overall thickness of the metal dots is quite thin.

The process of the present invention can also be used to deposit a pattern of metal plated areas or dots on a glass substrate, such as in making the original photomask. This process is illustrated in FIGS. 6–9 wherein the numeral 2 has been placed before the numerals corresponding to those of FIGS. 1–5. To prepare a metal on glass photomask 21, a glass substrate 22 is first cleaned and rinsed, and then sensitized and activated as above. After rinsing, the substrate 22 is dried and coated with a photoresist 210, such as Shipley's photoresist AZ 1350, to produce the device of FIG. 6. The photoresist layer can be dried and hardened, such as by baking at 75° C for 1 hour, if desired.

Figure 7:
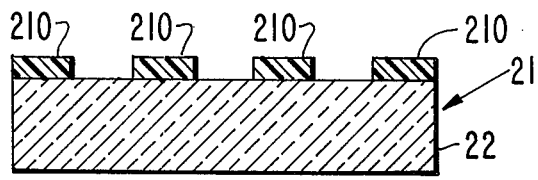
Figure 8:
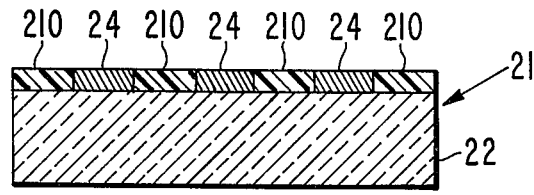
Figure 9:
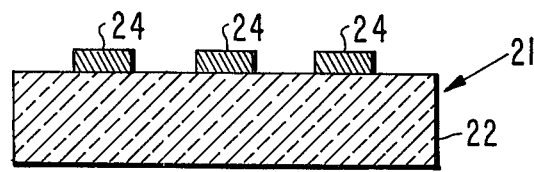

The photoresist 210 is then exposed to ultra violet light through a suitable mask and developed in a standard developer solution whereby selected portions are removed, as seen in FIG. 7. After rinsing, the photoresist is again exposed to a developer solution, which can be the Shipley developer or a sodium hydroxide solution, to either of which the activator has been added. The substrate 22 is then plated for 15–20 minutes in an electroless nickel sulfamate plating bath to deposit nickle dots 24 where the photoresist has been removed, as shown in FIG. 8. If the mask has no defects after inspection, the photoresist 210 is stripped away and the nickel deposit hardened by baking at 340° – 380° C for about one hour. The result is the finished product as shown in FIG. 9. If there are any defects in the completed photomask, one can proceed as described hereinabove for repair of the photomask.

Although the invention has been described by reference to the preparation of metal-on-glass photomasks, the process can also be used to deposit any metal pattern on an insulating substrate. For example, plastic substrates such as polyethylene terephthalate can be employed.

Plating solutions other than electroless nickle sulfamate may also be employed. For example, a nickel-phosphorous or a nickel-boron alloy may be deposited using known electroless plating solutions. Electroless cobalt alloy may also be deposited.

We claim:

1. A method of electrolessly plating a patterned metal layer on an insulating substrate which comprises:
   (a) sensitizing and activating said substrate,
   (b) coating said substrate with a photoresist,
   (c) exposing said photoresist through a mask,
   (d) developing said exposed photoresist with a developer solution to form a pattern exposing portions of said substrate, said developer solution containing an effective amount of an activator, and
   (e) immersing said substrate into an electroless plating solution whereby a pattern of metal is deposited onto said exposed portions of said substrate.

2. A method according to claim 1 wherein said substrate is glass.

3. A method according to claim 2 wherein said plating solution is a nickel sulfamate plating solution.

4. A method according to claim 1 wherein the sensitizing is accomplished by contacting said substrate with a solution containing stannous chloride.

5. A method according to claim 1 wherein the activating is accomplished by contacting the sensitized surface with a solution containing palladium chloride.

6. A method according to claim 1 wherein said remaining photoresist is removed after plating is complete.

7. A method of electrolessly plating a patterned metal layer on an insulating substrate which comprises:
   (a) sensitizing and activating said substrate,
   (b) applying a photoresist layer to said sensitized and activated substrate,
   (c) exposing said photoresist through a mask,
   (d) developing said exposed photoresist to form a pattern exposing portions of said substrate,
   (e) redeveloping said developed photoresist in a developer solution containing an effective amount of said activator, and
   (f) immersing said substrate into an electroless plating solution whereby a pattern of metal is deposited onto said exposed portions of said substrate.

8. A method according to claim 7 wherein the sensitizing is carried out by contacting said substrate with a solution containing stannous chloride.

9. A method according to claim 7 wherein the activating is carried out by contacting the sensitized surface with a solution containing palladium chloride.

* * * * *